United States Patent
Law et al.

(10) Patent No.: US 9,628,065 B2
(45) Date of Patent: Apr. 18, 2017

(54) SAFETY INSTRUMENTED PROCESS CONTROL APPARATUS AND METHODS

(71) Applicant: Fisher-Rosemount Systems, Inc., Round Rock, TX (US)

(72) Inventors: Gary Keith Law, Georgetown, TX (US); Kent Allan Burr, Round Rock, TX (US); Robert Stock, Austin, TX (US)

(73) Assignee: Fisher-Rosemount Systems, Inc., Round Rock, TX (US)

( * ) Notice: Subject to any disclaimer, the term of this patent is extended or adjusted under 35 U.S.C. 154(b) by 803 days.

(21) Appl. No.: 14/023,110

(22) Filed: Sep. 10, 2013

(65) Prior Publication Data
US 2014/0097700 A1    Apr. 10, 2014

Related U.S. Application Data

(60) Provisional application No. 61/710,464, filed on Oct. 5, 2012.

(51) Int. Cl.
*B23K 11/24* (2006.01)
*H02B 1/24* (2006.01)
(Continued)

(52) U.S. Cl.
CPC ............. *H03K 17/002* (2013.01); *H02H 3/05* (2013.01); *Y10T 307/74* (2015.04)

(58) Field of Classification Search
USPC ........................................................ 307/112
See application file for complete search history.

(56) References Cited

U.S. PATENT DOCUMENTS

| | | | |
|---|---|---|---|
| 6,853,292 B1* | 2/2005 | Kramer | G05B 9/03 324/500 |
| 2010/0007217 A1* | 1/2010 | Steele | H02J 1/102 307/131 |

FOREIGN PATENT DOCUMENTS

| | | | |
|---|---|---|---|
| JP | 2005044074 | * | 2/2005 |
| JP | 2010108129 | * | 5/2010 |
| JP | 2010108131 | | 5/2010 |

OTHER PUBLICATIONS

Great Britain Intellectual Property Office, "Search Report under Section 17(5)," issued in connection with Application No. GB1317612.8, Apr. 1, 2014, 3 pages.

(Continued)

*Primary Examiner* — Hal Kaplan
*Assistant Examiner* — Xuan Ly
(74) *Attorney, Agent, or Firm* — Hanley, Flight & Zimmerman, LLC

(57) ABSTRACT

Example apparatus and methods to remove power from a field device are disclosed. An example apparatus includes a first switch to control power to the field device, and a second switch comprising a first gate and a second gate. The second gate is electrically coupled in parallel to the first gate, and the second switch is electrically coupled in series to the first switch. The example apparatus also includes a first diagnostics controller to control the first and second gates, a first processor to control the first switch, a third switch to control power to the field device, and a fourth switch comprising a third gate and a fourth gate. The fourth gate is electrically coupled in parallel to the third gate, and the fourth switch is electrically coupled in series to the third switch. The example apparatus also includes a second processor to control the third switch, and a second diagnostics controller to control the third and fourth gates.

21 Claims, 5 Drawing Sheets

(51) Int. Cl.
H03K 17/00 (2006.01)
H02H 3/05 (2006.01)

(56) References Cited

OTHER PUBLICATIONS

Cahill, "Safety Instrumented System Architecture Diagnostics," Emerson Process Experts Blog, http://www.emersonprocessxperts.com/2011/09/safety-instrumented-system-architecture-diagnostics/#.Ui4g28afixU, Sep. 27, 2012, 3 pages.
Cheddie, "2oo3 Architecture," GlobalSpec.com, http://www.globalspec.com/reference/76371/203279/2oo3-architecture, Sep. 27, 2012, 2 pages.

* cited by examiner

SAFETY INSTRUMENTED PROCESS CONTROL APPARATUS AND METHODS

RELATED APPLICATION

This application claims the benefit under 35 U.S.C. §119 (e) to U.S. Provisional Application 61/710,464 titled "SAFETY INSTRUMENTED PROCESS CONTROL APPARATUS AND METHODS," filed Oct. 5, 2012, which is incorporated herein by this reference in its entirety.

FIELD OF THE DISCLOSURE

The present disclosure relates generally to process control systems and, more particularly, to apparatus and methods for safety instrumented process control systems.

BACKGROUND

Process control systems, such as those used in chemical, petroleum, pharmaceutical, pulp and paper, or other manufacturing processes, often include a backup or safety system to ensure operation of or to remove power from one or more field devices in the event of a malfunction of a primary system. Field devices, which may be, for example, device controllers, valves, valve actuators, valve positioners, switches and transmitters (e.g., temperature, pressure, flow rate, and chemical composition sensors) or combinations thereof, perform functions within the process control system such as opening or closing valves and measuring or inferring process parameters. During an emergency, power may be removed from the field devices.

Known safety instrumented process control systems typically include a controller of an input/output (I/O) card having multiple channels. When power is to be removed from a field device coupled to one of the channels of the I/O card, a group shutdown of all of the channels is required. To mitigate the effect of a group shutdown, I/O cards are typically deployed in redundant pairs. However, a failure on a single channel on either one of the cards in the redundant pair prevents the removal of power from a field device, which reduces the overall safety of the system.

SUMMARY

An example apparatus to remove power to a field device is disclosed. The example apparatus includes a first switch to control power to the field device, and a second switch comprising a first gate and a second gate. The second gate is electrically coupled in parallel to the first gate, and the second switch is electrically coupled in series to the first switch. The example apparatus also includes a first diagnostics controller to control the first and second gates, a first processor to control the first switch, a third switch to control power to the field device, and a fourth switch comprising a third gate and a fourth gate. The fourth gate is electrically coupled in parallel to the third gate, and the fourth switch is electrically coupled in series to the third switch. The example apparatus also includes a second processor to control the third switch, and a second diagnostics controller to control the third and fourth gates.

An example method of controlling power to a field device is also disclosed. The method includes sending a signal to remove power to the field device, opening a first switch, and measuring a first voltage across the first switch. If the first voltage is substantially non-zero, instructing a first diagnostic controller to remove power to the first switch by opening a second switch. The second switch is electrically coupled in series to the first switch and comprises first and second gates. The first gate is electrically coupled in parallel to the second gate.

DETAILED DESCRIPTION

Figure 1:
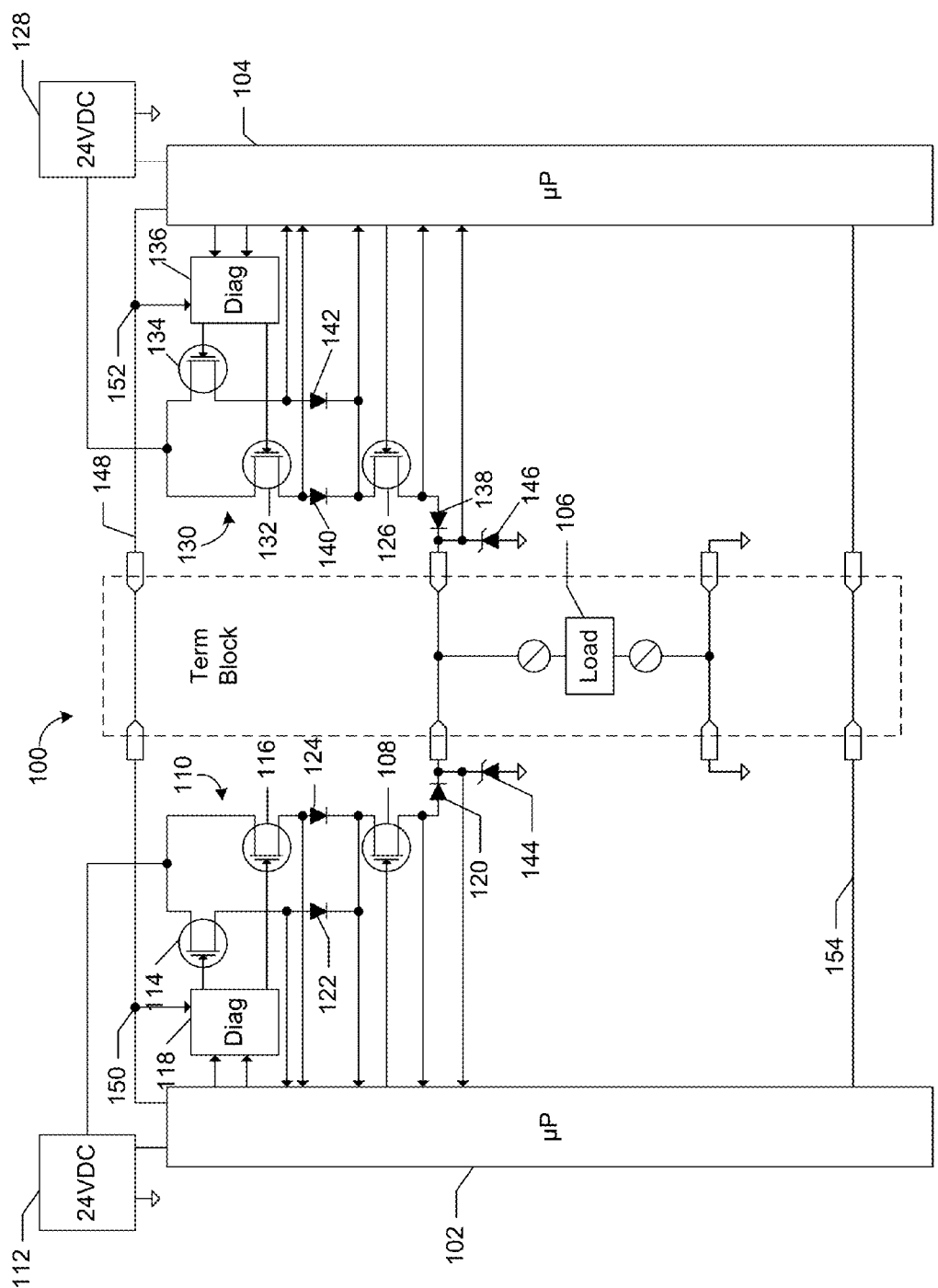
FIG. 1 is a schematic diagram of an example safety apparatus in accordance with the teachings of this disclosure.

Although this specification discloses example apparatus and methods including, among other components, software and/or firmware executed on hardware, it should be noted that such apparatus are merely illustrative and should not be considered as limiting. For example, it is contemplated that any or all of these hardware, software, and firmware components could be embodied exclusively in hardware, exclusively in software, or in any combination of hardware and software. Accordingly, while the following describes example apparatus and methods, persons of ordinary skill in the art will readily appreciate that the examples provided are not the only way to implement such apparatus and methods.

An example process control system includes a plurality of field devices that perform operations (such as, for example, controlling valves, controlling motors, controlling boilers, monitoring, measuring parameters, etc.) associated with a particular process (such as, for example, a chemical process, a petroleum process, a pharmaceutical process, a pulp and paper process, etc.). Some process control systems are critical process systems, which are systems that are to be secured in a safe state should a problem occur. For example, in some situations including, for example, an emergency situation, electrical power supplied to the field devices is to be cut off or removed. Process control equipment that has a high degree of diagnostic coverage performs well during emergency shutdown applications. Process control equipment may be implemented with different degrees of fault tolerance. For example, a hardware fault tolerance of one (e.g., 1oo2, 1oo3) implies that one out of two or three components could fail and the function associated with each of these components would still be performed.

A Safety Instrumented System (SIS), which includes hardware, software and firmware controls of a process control system, is used to perform specific control functions to maintain safe operation and/or to shut down the process control system. An example SIS includes a controller card (e.g., an I/O card, a microprocessor) that is to control (e.g., gate, switch, regulate) the flow of power to one or more field devices. Example cards have multiple channels or elements (e.g., transistors, FETs, relays, switches) arranged to provide redundancy, such that if one element fails, another element maintains the ability to provide the desired function, such as, for example, breaking or interrupting an electrical path to a field device(s) to remove power from the field device(s).

Some example controller or I/O cards have 8, 16 or 32 channels. In some examples, the individual channels of the card are utilized to remove power to respective field devices and/or the entire card can be shutdown at the master power level to remove power from all the channels on a single card and, thus, ensure a safe shutdown of all of the field device(s) coupled to the card.

In the example systems disclosed herein, the SIS incorporates redundancy such that there is selectable redundancy on a per channel basis. The redundancy ensures that critical channels, when selected, are operable during the operation of the SIS. Because the redundancy may be added to channels on a selective basis, the increased expense of adding redundancy to other channels that do not require redundancy is avoided. Thus, as disclosed in more detail below, the example apparatuses utilize an arrangement (e.g., architecture) of elements at the output level to control the flow of power to field devices while providing increased redundancy to remove power if one or more of the elements fails. In addition, the example apparatuses and methods also provide multiple diagnostic checks (e.g., tests) to ensure readiness of the shutdown capability.

FIG. 1 is a schematic diagram of an example redundant safety apparatus 100 that may be used, for example, to remove power to a field device in a process control system. The apparatus 100 includes a first processor 102 (e.g., a microprocessor, a card, an I/O card, an FPGA, an ASIC and/or any other suitable processing device) and a second processor 104 for controlling the flow of power to a load 106 (e.g., a field device, a controller, a valve, an actuator, a valve positioner, a switch, a transmitter and/or any other load associated with a process control device). The first processor 102 is coupled to a first element 108 and a second element 110 for controlling the application or supply of electrical power from a first power supply 112 to the load 106. In the example shown, the first and second elements 108, 110 may include, for example, one or more switching elements (e.g., a metal oxide semiconductor field effect transistor (MOSFET), a junction field effect transistor (JFET), a bipolar junction transistor (BJT), an electromechanical switching element, and/or any other suitable switching element(s)). The second element 110 includes a first gate 114 and a second gate 116 that are coupled (e.g., electrically connected) in parallel. In this example, the second element 110 is coupled (e.g., electrically connected) in series with the first element 108. When the first element 108 and one or both of the first and second gates 114, 116 of the second element 110 are electrically closed (i.e., the circuit is complete so that electrical current is conducted through the elements 108, 110), electrical power is supplied from the first power supply 112 to the load 106. However, when either the first element 108 or both the first and second gates 114, 116 are electrically open (i.e., the circuit is incomplete and electrical current is not conducted), the power to the load 106 is cutoff (e.g., removed, broken). In this example, the second element 110 operates as a safety mechanism (e.g., a backup switch). Thus, where the safety operation is to open the circuit to remove power to the load 106 (e.g., a field device) and the first element 108 fails closed (i.e., fails to open and continues to conduct electricity), the second element 110 is implemented to shutoff the flow of power through the first element 108 and to the load 106 via an opening of both the first and second gates 114, 116.

In the example apparatus 100, the first element 108 is controlled by the first processor 102. The first processor 102 sends a signal to open and/or close the first element 108 to control the application of power through the first element 108 to the load 106. The first and second gates 114, 116 of the second element 110 are controlled by a first diagnostic controller 118, which is communicatively coupled to the first processor 102. The first diagnostic controller 118 may be, for example, an FPGA, an ASIC, or any other combination of components to control and test the first and second gates 114, 116 as further disclosed in detail below.

In operation, the first diagnostic controller 118 sends a signal to open and/or close the first gate 114 and/or the second gate 116 to control the application or supply of power through the second element 110 to the first element 108. The first element 108, the first gate 114 and the second gate 116 are associated with respective diodes 120, 122, 124. The diodes 120, 122, 124 may be any suitable type of diode or any other suitable rectifying device. The diodes 120, 122, 124 are used in conjunction with the voltage readings disclosed in detail below.

As shown in FIG. 1, the second processor 104 includes output circuitry similar to that of the first processor 102 and functions as a point of redundancy to supply and remove power to the load 106. The second processor 104 controls a third element 126 to control a flow of power from a second power supply 128 to the load 106. Alternatively, the power supplies 112, 128 may be the same power source. The apparatus 100 includes a fourth element 130 to control power to the third element 126. In the example shown, the third and fourth elements 126, 130 may include, for example, one or more switching elements (e.g., a metal oxide semiconductor field effect transistor (MOSFET), a junction field effect transistor (JFET), a bipolar junction transistor (BJT), an electromechanical switching element, and/or any other suitable or switching element(s)). The fourth element 130, in this example, includes a third gate 132 and a fourth gate 134 coupled (e.g., electrically connected) in parallel. In this example, the fourth element 130 is coupled (e.g., electrically connected) in series with the third element 126. A second diagnostic controller 136, which is communicatively coupled to the second processor 104, controls the third and fourth gates 132, 134. When the third element 126 and one or both of the third and fourth gates 132, 134 are electrically closed, electrical power is supplied from the second power supply 128 to the load 106. However, when either the third element 126 or both the third and fourth gates 132, 134 are electrically open, power to the load 106 is cutoff. The fourth element 130 operates as a safety mechanism. Thus, where the safety operation is to open the circuit to remove power to the load 106 (e.g., a field device) and the third element 126 fails closed (i.e., does not operate to open and break the circuit), the fourth element 130 is implemented to prevent the flow of power through the third element 126 to the load 106. The third element 126, the third gate 132 and the fourth gate 134 also are associated with respective diodes 138, 140 and 142 that are used in conjunction with the voltage readings disclosed in more detail below. Similar to the diodes 120, 122, 124, the diodes 138, 140, 142 may be any suitable type of diode or any other suitable type of rectifying device.

As shown in the FIG. 1, the output circuitry of the first processor 102 includes a first Zener diode 144 and the output circuitry of the second processor 104 includes a second Zener diode 146. The first and second Zener diodes 144, 146 are safety mechanisms to allow the flow of power to a ground if the voltage in the circuitry becomes too high (i.e., when the voltage is above a certain breakdown voltage).

In operation, the first processor 102 and its respective output circuitry and/or the second processor 104 and its respective output circuitry may supply power to the load 106. In an emergency showdown situation, where power is to be removed from the load 106, the first and second processors 102, 104 and the first and second diagnostic controllers 118, 136 operate the first, second, third and fourth elements 108, 110, 126, 130 to electrically open the circuit and, thus, cut off power to the load 106. Therefore, in these examples, safety shutoff redundancy exists at the processor output level. In other words, each of the first and second processors 102, 104 is capable of gating power to the load 106 and providing its own safety mechanism (e.g., the second and fourth elements 110, 130) in the event the first element 108 and/or the third element 126 fails closed.

For example, in an emergency shutdown situation where the power to the load 106 is to be removed, assuming the second element 110 is closed, the first processor 102 opens the first element 108 to cut off power flowing from the first power supply 112 to the load 106. The first processor 102 then measures the voltage across the first element diode 120. If a substantially zero voltage is detected, then the first element 108 has operated properly and no power is flowing to the load 106. However, if the first element 108 has failed closed (i.e., the circuit is complete and power is flowing through the first element 108 to the load 106), then the first processor 102 detects a voltage (e.g., a voltage greater than zero) across the first element diode 120. In this instance, the first processor 102 sends a signal to the first diagnostic controller 118 to open the second element 110 (i.e., the first and second gates 114, 116). If the second element 110 is open, then power is cutoff to the first element 108 and, thus, to the load 106. Therefore, the second element 110 acts as a backup or safety mechanism in the event that the first element 108 fails to open.

Likewise, in the event of an emergency shutdown situation, the second processor 104 opens the third element 126. However, in the event the third element 126 fails closed, the second processor 104 sends a signal to the second diagnostic controller 136 to open the third and fourth gates 132, 134 of the fourth element 130, which prevents power from flowing to the third element 126 and, thus, to the load 106.

As shown in the example apparatus 100, safety shutoff redundancy is also formed at the overall processor point. The first and second diagnostic controllers 118, 136 are communicatively coupled (e.g., cross-coupled) to each other and the first and second processors 102, 104 via a first communication line 148 at respective nodes 150, 152. If the first processor 102 fails, it will not be able to control the first and/or second elements 108, 110, and if the second processor 104 fails, it will not be able to control the third and/or fourth elements 126, 130. However, because the first and second processors 102, 104 and the first and second diagnostic controllers 118, 136 are communicatively coupled, an operable processor can send a signal to the diagnostic controller associated with the failed processor to open the respective elements and cutoff power to the load 106. In some examples, the first communication line 148 is normally a static line. Thus, during normal operations of the process control system, the first communication line 148 is free of signals. When there is a failure and one of the processors 102, 104 is to control the other elements 110, 130 associated with the other processor, a pulse is generated and communicated through the first communication line 148. Therefore, in some examples, the redundancy control may be implemented based on a detection of any signal on the first communication line 148.

For example, in an emergency shutdown situation, the first processor 102 is to open the first element 108 and the second processor 104 is to open the third element 126 to remove the flow of power to the load 106. In the event failure occurs with a processor, for example, the first processor 102 fails to respond, the second processor 104 recognizes that the first processor 102 has failed such as, for example, via communications or lack of communications through the first communication line 148 (e.g., when the communication line 148 is not a static line) and/or a second communication line 154 and/or through other sensors in the example system 100. Because the first processor 102 has failed, the first processor 102 will not send a signal to the first and/or second elements 108, 110 to cutoff power to the load 106 and, thus, power will continue to flow through to the load 106. The second processor 104, or the second diagnostic controller 136, then sends a signal via the first communication line 148 to the first diagnostic controller 118 to open the second element 110 (i.e., the first and second gates 114, 116) to prevent the flow of power to the first element 108 and, thus, to the load 108. This redundancy at the point of the processors ensures proper shutoff in the event a processor fails during an emergency shutdown situation.

The apparatus 100 also forms another point of redundancy in the first and second diagnostic controllers 118, 136 and the second and fourth elements 110, 130 as described in further detail below. This point of redundancy is operable to ensure that power is supplied to the load 106 during testing of the readiness of the safety apparatus 100. Although the apparatus 100 is depicted as having two channels, the apparatus 100 may have any plurality of channels to increase redundancy.

Figure 2:
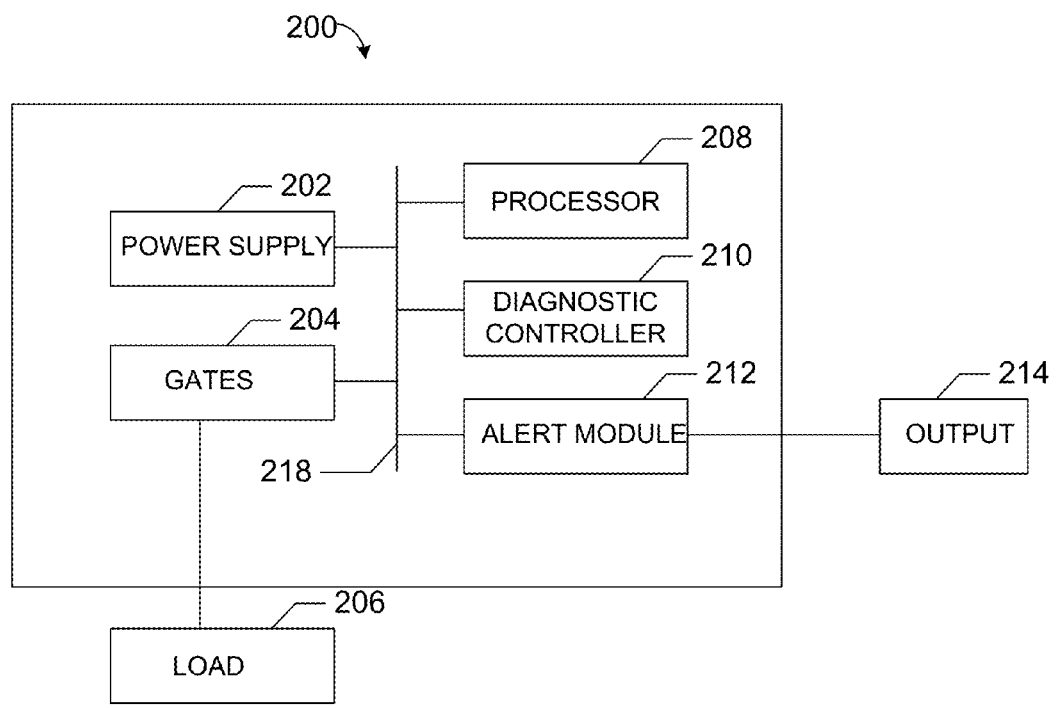
FIG. 2 is a block diagram of the example apparatus of FIG. 1.

FIG. 2 is a block diagram of an example safety apparatus 200, which may incorporate the example redundant safety apparatus 100 of FIG. 1. The example apparatus 200 includes a power supply 202 coupled to a plurality of gates 204. In the illustrated example, the gates 204 control the flow of power to a load 206. The power supply 202 may be, for example, the first or second power supply 112, 128 from the safety apparatus 100 shown in FIG. 1, and the gates 204 may be, for example, one or more of the first, second, third of fourth elements 108, 110, 126, 130 from the safety apparatus 100 shown in FIG. 1. In the illustrated example, the gates 204 may be implemented using a transistor, a FET or a relay to control the power supplied from the power supply 202 to the load 206.

As shown in FIG. 2, the apparatus 200 includes a processor 208 coupled to the gates 204. The processor 208 sends signals to the gates 204 to open and close the gates 204 and, thus, control the flow of power supplied to the load 206. In the illustrated example, the processor 208 also determines whether the gates 204 have been properly opened and/or closed. For example, the processor 208 may send a signal to one or more of the gates 204 to shutoff or remove power to the load 206. The processor 208 may then measure whether power is still flowing across the gate(s) 204 to determine whether the gate(s) 204 have opened. In the event that the gate(s) 204 have not opened, the processor 208 may then send one or more signals to one or more other gate(s), such as, for example, gate(s) disposed before the first gate, to cutoff power to the failed gate (i.e., the first gate in this example).

In the illustrated example, the processor 208 is also coupled to a diagnostic controller 210, which is also coupled to the gates 204. The diagnostic controller 210 may be, for example the first or second diagnostic controllers 118, 136 that control the second and fourth elements 110, 130, respectively, from the example apparatus 100 shown in FIG. 1. The diagnostic controller 210 of the illustrated example performs multiple opening and closing tests to ensure the gates 204 are operating correctly and, therefore, are ready for use in the event of an emergency or other situation triggering operation of the safety apparatus 200.

When testing the readiness of the safety apparatus 200, the diagnostic controller 210 opens and/or closes gates while reading voltage levels associated with the gates. For example, where two gates are electrically coupled in parallel (e.g., gates 114, 116 of the apparatus of FIG. 1), the diagnostic controller 210 tests the readiness of the apparatus 200 by, for example, opening the first gate, closing the second gate, and measuring a voltage associated with the first gate. If substantially zero voltage is detected, the apparatus 200 determines that the first gate has operated correctly and, thus, is ready to operate should operation of the safety apparatus 200 be triggered. To continue the readiness testing, the diagnostic controller 210 also closes the first gate, opens the second gate, and measures a voltage associated with the second gate. If substantially zero voltage is detected, the apparatus 200 determines that the second gate has operated correctly and, thus, is ready to operate should operation of the safety apparatus 200 be triggered. A cycle of alternating testing between the first gate and the second gate may continue as long as the gates are opening and closing properly. In some examples, the readiness testing may be performed about every 50 milliseconds. Though other suitable periods may be used including, for example, non-uniform periods (i.e., aperiodically).

Also, in some example process systems, it is desired to supply power continuously to the load 206 when there is no emergency or other situation that causes the safety apparatus 200 to remove power from the load 206. In such example apparatuses, two gates are provided and electrically coupled in parallel to provide redundancy to the apparatus. Thus, a first gate may remain closed to supply power to the load while a second gate is opened and tested. Then, the second gate closes to supply power to the load while the first gate is opened and tested.

In the illustrated example, as disclosed above, the processor 208 and the diagnostic controller 210 perform readiness testing on the gates 204 to ensure the gates 204 are operating correctly. In the event that one or more of the gate(s) 204 is not operating correctly (e.g., has failed closed and does not open), the apparatus 200 includes an alert module 212. The alert module 212 sends an output signal 214 to alarm the appropriate personnel that one or more of the gate(s) 204 of the safety apparatus 200 is malfunctioning and should be repaired or replaced.

In the example apparatus 200 of FIG. 2, the power supply 202, the gates 204, the processor 208, the diagnostic controller 210 and the alert module 212 are communicatively coupled via communication links 218. The communication links 218 may be any type of wired (e.g., a databus, a USB connection, etc.) or wireless communication mechanism (e.g., radio frequency, infrared, etc.) using any past, present or future communication protocol (e.g., Bluetooth, USB 2.0, etc.). Also, the components of the example apparatus 200 may be integrated in one device, distributed over two or more devices and/or duplicated for redundancy and increased safety.

While example manners of implementing the safety apparatuses 100, 200 have been illustrated in FIGS. 1 and 2, one or more of the elements, processes and/or devices illustrated in FIGS. 1 and 2 may be combined, divided, re-arranged, omitted, eliminated and/or implemented in any other way. Further, the example processors 102, 104, 208, the example diagnostic controllers 118, 136, 210, the example power supplies 112, 128, 202, the example gates 108, 114, 116, 126, 132, 134, 204, the example alert module 212, the example output 214 and/or, more generally, the example apparatuses 100, 200 of FIGS. 1 and 2, may be implemented by hardware, software, firmware and/or any combination of hardware, software and/or firmware. Thus, for example, any of the example processors 102, 104, 208, the example diagnostic controllers 118, 136, 210, the example power supplies 112, 128, 202, the example gates 108, 114, 116, 126, 132, 134, 204, the example alert module 212, the example output 214 and/or, more generally, the example apparatuses 100, 200 of FIGS. 1 and 2, could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or method claims of this patent are read to cover a purely software and/or firmware implementation, at least one of the example, example processors 102, 104, 208, the example diagnostic controllers 118, 136, 210, the example power supplies 112, 128, 202, the example gates 108, 114, 116, 126, 132, 134, 204, the example alert module 212, and/or the example output 214 are hereby expressly defined to include a tangible computer readable medium such as a memory, DVD, CD, Blu-ray, etc. storing the software and/or firmware. Further still, the example apparatuses 100, 200 of FIGS. 1 and 2 may include one or more elements, processes and/or devices in addition to, or instead of, those illustrated in FIGS. 1 and 2, and/or may include more than one of any or all of the illustrated elements, processes and devices.

Figure 3:
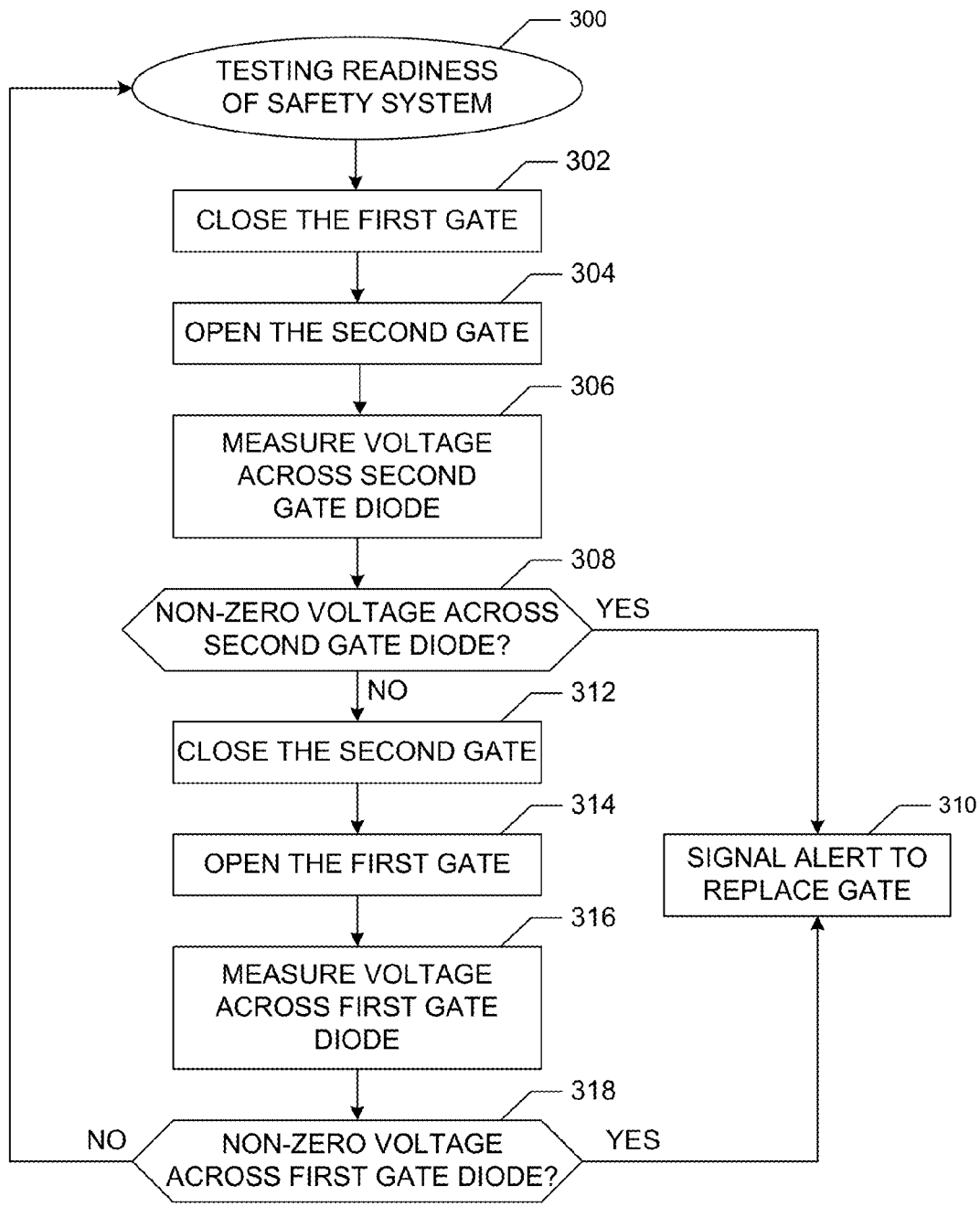
FIG. 3 is a flowchart representing an example method of operation of the apparatus of FIG. 1.
Figure 4:
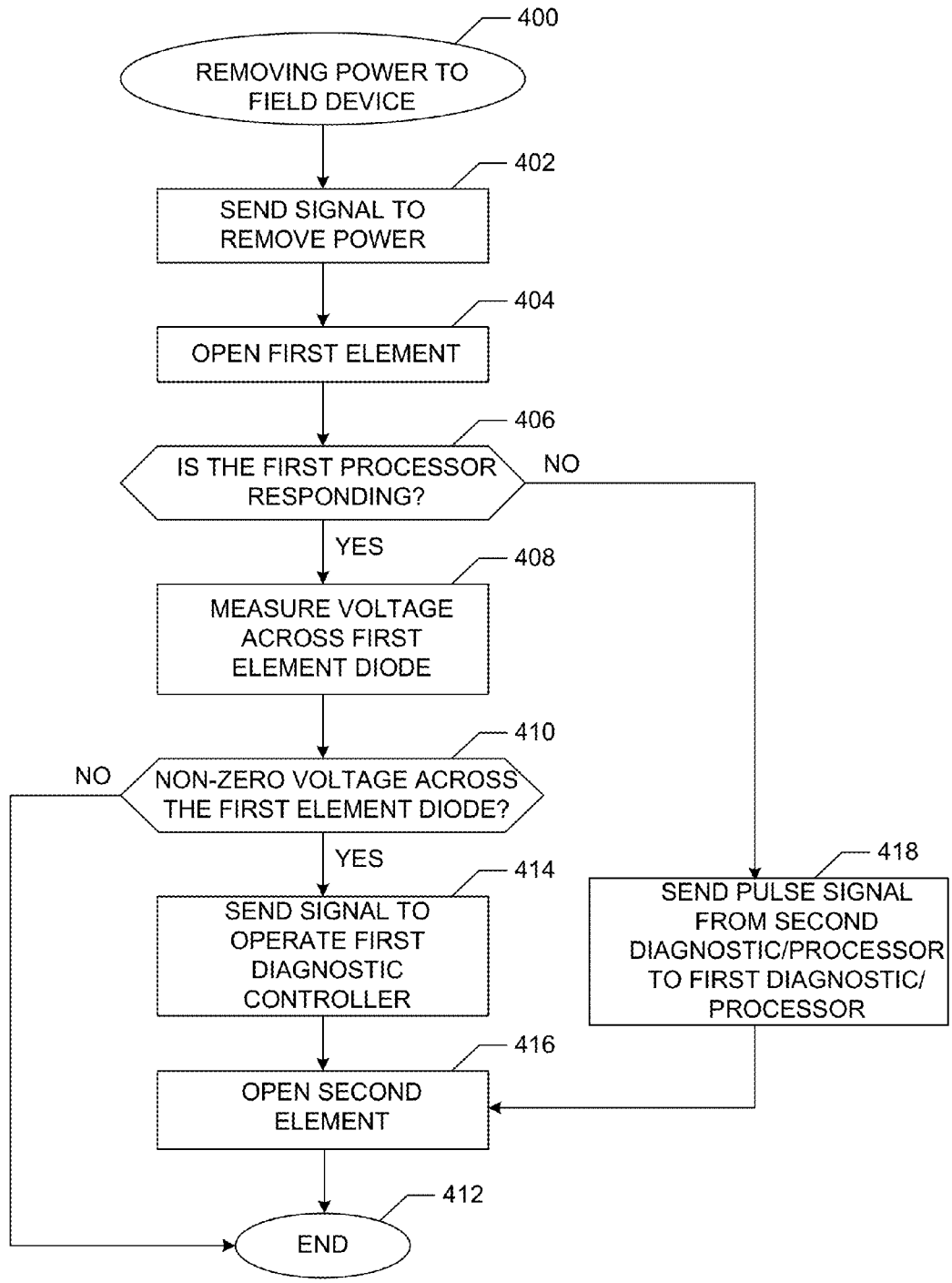
FIG. 4 is a flowchart representing another example method of operation of the apparatus of FIG. 1.

Flowcharts representative of example processes or methods for implementing the example apparatuses 100, 200 of FIGS. 1 and 2 are shown in FIGS. 3 and 4. In this example, the methods may be implemented using a program for execution by a processor such as the processor 512 shown in the example computer 500 discussed below in connection with FIG. 5. The program may be embodied in software stored on a tangible computer readable medium such as a CD-ROM, a floppy disk, a hard drive, a digital versatile disk (DVD), a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowcharts illustrated in FIGS. 3 and 4, many other methods of implementing the example apparatuses 100, 200 may alternatively be used. For example, the order of execution of the blocks may be changed, and/or some of the blocks described may be changed, eliminated, or combined.

As mentioned above, the example methods of FIGS. 3 and 4 may be implemented using coded instructions (e.g., computer readable instructions) stored on a tangible computer readable medium such as a hard disk drive, a flash memory, a read-only memory (ROM), a compact disk (CD), a digital versatile disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer readable storage medium is expressly defined to include any type of computer readable storage device and/or storage disk and to exclude propagating signals and to exclude transmission media. Additionally or alternatively, the example processes of FIGS. 3 and 4 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

An example method 300 of testing the readiness of an apparatus (block 300) is shown in FIG. 3. The example method 300 may be, for example, performed by the first diagnostic controller 118 and the first processor 102 on the first and second gates 114, 116 and/or by the second diagnostic controller 136 and the second processor 104 on the third and fourth gates 132, 134 of the example apparatus 100 shown in FIG. 1. For example, as shown in FIG. 1, the first element 108 is to control the flow of power from the first power supply source 112 to the load 106. In the event that the first element 108 fails closed during an emergency shutdown situation, the second element 110, which includes the first and second gates 114, 116, is to cutoff power to the first element 108 and, thus, to the load 106. The example method 300 may be used as another point of redundancy, to ensure the second element 110 (i.e. the safety mechanism) is operating properly.

The example process 300 includes closing the first gate (block 302), opening the second gate (block 304) and measuring a voltage across the second gate diode (block 306). The voltage may be measured, for example, by the first processor 102 as shown in the apparatus 100 of FIG. 1. If a voltage is identified (block 308) (i.e., the voltage is not zero and power is flowing through the second gate), the second gate is determined to have failed to open and an alert signal to replace the second gate is output (block 310) by, for example, sending a visual and/or audible alarm to a process control workstation. If no voltage is identified (a voltage substantially equal to zero) (block 308), it is determined that the second gate was properly opened and power was cutoff through the second gate.

The example process 300 also includes closing the second gate (block 312) and opening the first gate (block 314). The voltage is measured across the first gate diode (block 316). The voltage may be measured, for example, by the first processor. If a voltage is identified (block 318) (i.e., the voltage is not zero and power is flowing through the first gate), the first gate is determined to have failed to open (i.e., has failed close), and the example process 300 signals an alert to replace the first gate (block 310) by, for example, sending a visual and/or audible alarm to a process control workstation. If no voltage is identified (block 318), it is determined that the first gate was properly opened, and the example process to test the readiness of the safety apparatus 300 restarts. The example process 300 may repeat about every 50 milliseconds, or at shorter time intervals, thereby repeatedly checking that the second element 110 and/or the fourth element 130, or safety mechanisms, are operating properly (e.g., are ready).

In the illustrated example, one of the two gates is always closed and, thus, providing a closed circuit to supply power to the load. In some example process apparatuses, a constant supply of power is desired. Therefore, employing two gates electrically coupled in parallel allows the diagnostic controller to perform system diagnostics including readiness evaluations by opening and checking one gate while maintaining a closed gate in parallel to supply a flow of power to the load without interruption.

FIG. 4 is a flowchart of an example method 400 for removing power to a field device (block 400). The example process 400 may be performed, for example, by the example system 100 shown in FIG. 1 to remove power to the load 106. For example, as shown in FIG. 1, the first element 108 is to control the flow of power from the first power supply source 112 to the load 106. In the event that the first element 108 fails closed during an emergency shutdown situation, the second element 110, which includes the first and second gates 114, 116, is to cutoff power to the first element 108 and, thus, to the load 106. Also, if the first processor 102 fails to respond, the second processor 104 or second diagnostics controller 136 sends a pulse signal to the first diagnostics controller 118 to open the second element 110 and cutoff power to the load 106.

The example process 400 includes sending a signal to remove power from a field device (block 402). For example, a process control workstation or other logic solver sends a signal to the first processor to remove power from the field device/load. The first processor sends a signal to open the first element (block 404) and, thus, removes power flowing to the field device. If it is determined that the first processor is responding (block 406), then the voltage across the first element diode is measured (block 408) to ensure the first element has properly cutoff power to the load. In the example process 400, it is determined whether there is a voltage across the first element diode (block 410). If no voltage (e.g., substantially zero voltage) is detected across the first element diode, the first element has been properly opened, no power is flowing to the field device and the example process 400 ends (block 412). If, however, a substantially non-zero voltage is detected (block 410), a signal is sent to operate the first diagnostic (block 414), which is used to open the second element (block 416) to remove power to the first element and, thus, to the field device. In this example, it is assumed that the second element will function properly due to implementation of the example readiness testing process 300 of FIG. 3. With the second element open (block 416), the example process 400 ends (block 412).

In the example process 400 of FIG. 4, if is it determined that the first processor is not responding (block 406), the first processor will not function to open the first element and/or trigger operation of the first diagnostic element to open the second element and remove power to the field device. In the event that the first processor is not responding (block 406), the second diagnostic controller, or second processor, recognizes the malfunction of the first processor and sends a pulse signal to the first diagnostic controller (block 418). The first diagnostic controller opens the second element (block 416) to remove power to the first element and, thus, cuts off power to the field device, and the example process 400 ends (block 412).

Figure 5:
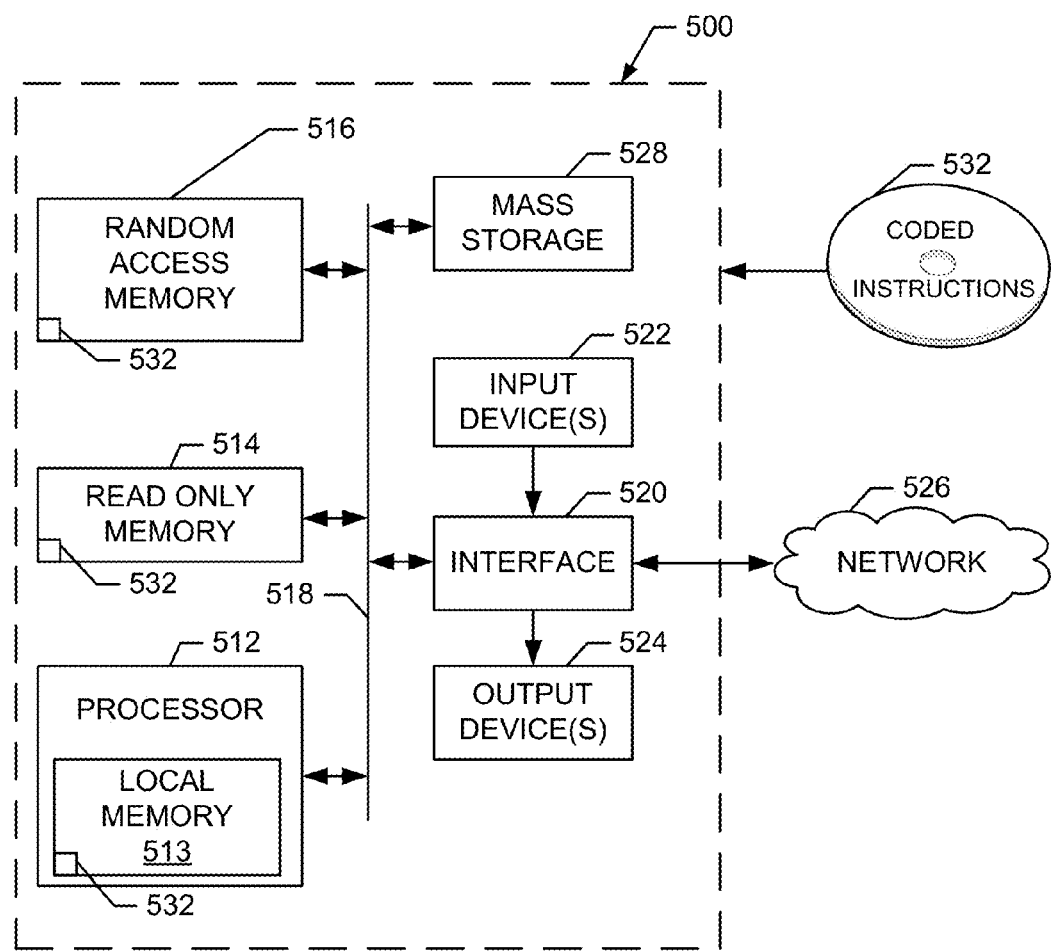
FIG. 5 illustrates an example processor platform that may be used to implement the methods of FIGS. 3 and/or 4 to implement any or all of the example methods, apparatuses and/or apparatus disclosed herein.

FIG. 5 is a block diagram of an example computer 500 capable of executing the instructions of FIGS. 3 and 4 to implement the example apparatuses 100, 200 of FIGS. 1 and 2. The computer 500 can be, for example, a server, a personal computer, an Internet appliance, a Blu-ray player, or any other type of computing device.

The apparatus 500 of the instant example includes a processor 512. For example, the processor 512 can be implemented by one or more microprocessors or controllers from any desired family or manufacturer.

The processor 512 includes a local memory 513 (e.g., a cache) and is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 516 may be implemented by flash memory and/or any other desired type of memory device. Access to the main memory 514, 516 is controlled by a memory controller (not shown).

The computer 500 also includes an interface circuit 520. The interface circuit 520 may be implemented by any type of interface standard, such as an Ethernet interface, a universal serial bus (USB), and/or a PCI express interface.

One or more input devices 522 are connected to the interface circuit 520. The input device(s) 522 permit a user to enter data and commands into the processor 512. The input device(s) can be implemented by, for example, a keyboard, a mouse, a touchscreen, a track-pad, a trackball, isopoint and/or a voice recognition system.

One or more output devices 524 are also connected to the interface circuit 520. The output devices 524 can be implemented, for example, by display devices (e.g., a liquid crystal display, a cathode ray tube display (CRT), a printer and/or speakers). The interface circuit 520, thus, typically includes a graphics driver card.

The interface circuit 520 also includes a communication device such as a modem or network interface card to facilitate exchange of data with external computers via a network 526 (e.g., an Ethernet connection, a digital subscriber line (DSL), a telephone line, coaxial cable, a cellular telephone system, etc.).

The computer 500 also includes one or more mass storage devices 528 for storing software and data. Examples of such mass storage devices 528 include floppy disk drives, hard drive disks, compact disk drives and digital versatile disk (DVD) drives. The mass storage device 528 may implement a local storage device.

Coded instructions 532 to implement the methods of FIGS. 3 and 4 may be stored in the mass storage device 528, in the volatile memory 514, in the non-volatile memory 516, and/or on a removable storage medium such as a CD or DVD.

The example systems and methods disclosed herein create multiple points of redundancy on a per channel basis to ensure proper shutoff of a field device.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a first switch to control power to a field device;
a second switch comprising a first gate and a second gate, the second gate electrically coupled in parallel to the first gate, wherein the second switch is to provide parallel current paths through the second switch, the first and second switches defining a current path between a source of the power and the field device;
a first diagnostic controller to control the first and second gates independently of one another to verify a first redundant control of the field device;
a first processor to control the first switch;
a third switch to control power to the field device;
a fourth switch comprising a third gate and a fourth gate, the fourth gate being electrically coupled in parallel to the third gate, wherein the fourth switch is to provide parallel current paths through the fourth switch, the third and fourth switches defining a current path between the source of the power and the field device;
a second processor to control the third switch; and
a second diagnostic controller to control the third and fourth gates independently of one another to verify a second redundant control of the field device.

2. The apparatus as defined in claim 1, wherein the first diagnostic controller is to be communicatively coupled to the second diagnostic controller.

3. The apparatus as defined in claim 1, wherein the first processor and the second processor are to be communicatively coupled.

4. The apparatus as defined in claim 1, wherein the first processor is to be communicatively coupled to the first diagnostic controller and the second processor is to be communicatively coupled to the second diagnostic controller.

5. The apparatus as defined in claim 1, wherein the first processor is to be communicatively coupled to the second diagnostic controller and the second processor is to be communicatively coupled to the first diagnostic controller.

6. The apparatus as defined in claim 1, wherein the power is provided by a plurality of sources.

7. The apparatus as defined in claim 1, wherein one or more of the first switch, the first gate, the second gate, the third switch, the third gate or the fourth gate comprises a transistor, a field-effect transistor (FET) or a relay.

8. The apparatus as defined in claim 1, wherein the first diagnostic controller is to control the fourth switch when the third switch or the second processor fails.

9. The apparatus as defined in claim 1, wherein the second diagnostic controller is to control the second switch when the first switch or the first processor fails.

10. The apparatus as defined in claim 1, wherein the first diagnostic controller is to alternately test the first and second gates, and the second diagnostic controller is to alternately test the third and the fourth gates.

11. The apparatus as defined in claim 10, wherein the testing of the gates is to occur periodically.

12. The apparatus as defined in claim 1, wherein the first processor is to measure a first voltage associated with the first gate, a second voltage associated with the second gate, and a third voltage associated with the first switch.

13. The apparatus as defined in claim 1, wherein the second processor is to measure a fourth voltage associated with the third gate, a fifth voltage associated with the fourth gate, and a sixth voltage associated with the third switch.

14. A method comprising:
sending a signal to a first processor to remove power to a field device;
opening a first switch; and
measuring a first voltage across the first switch, wherein if the first voltage is substantially non-zero, instructing a first diagnostic controller to remove power to the first switch by opening a second switch, the second switch providing parallel current paths via first and second gates that are operated independently of one another, the second switch electrically coupled in series to the first switch, the first gate electrically coupled in parallel to the second gate, the first and second switches defining a current path between a source of the power and the field device to verify redundant control of the field device.

15. The method as defined in claim 14, further comprising determining whether the first processor is responding and if the first processor is not responding, sending a signal from a second diagnostic controller or a second processor to the first diagnostic controller to open the second switch.

16. The method as defined in claim 14, further comprising:
   closing the first gate;
   opening the second gate; and
   measuring a second voltage associated with the second gate, wherein, if the second voltage is substantially zero, closing the second gate, opening the first gate and measuring a third voltage associated with the first gate, and if the measurement for the second or third voltage is substantially non-zero, signaling an alert.

17. The method as defined in claim 16, wherein the closing and opening of the first and second gates is to occur periodically during operation of the field device.

18. The method as defined in claim 14, further comprising removing power to the first switch by opening the second switch when one or more of the first processor or the first switch fails.

19. An apparatus comprising:
   means for verifying redundant control of a field device comprising means for controlling power to a first switch, the means for verifying redundant control having redundant means for controlling a second switch, the second switch electrically coupled in parallel to the first switch, wherein the second switch includes first and second gates that are independently controlled of one another, the redundant means for controlling power to the second switch and the means for controlling power to the first switch electrically coupled in series and defining a current path between a power source and the field device.

20. The apparatus as defined in claim 19, further comprising means for alternately testing the first and second gates of the second switch.

21. The apparatus as defined in claim 1, further including a diode between the first switch and the field device.

* * * * *